(12) United States Patent
Ciarallo et al.

(10) Patent No.: US 8,185,370 B2
(45) Date of Patent: May 22, 2012

(54) DISCRETE EVENT SIMULATION TOOL COMBINING PROCESS-DRIVEN AND EVENT-DRIVEN MODELS

(75) Inventors: Frank W. Ciarallo, Beavercreek, OH (US); Vishnu Kesaraju, Beavercreek, OH (US)

(73) Assignee: Wright State University, Dayton, OH (US)

( * ) Notice: Subject to any disclaimer, the term of this patent is extended or adjusted under 35 U.S.C. 154(b) by 0 days.

(21) Appl. No.: 12/468,283

(22) Filed: May 19, 2009

(65) Prior Publication Data

US 2011/0040549 A1 Feb. 17, 2011

Related U.S. Application Data

(60) Provisional application No. 61/054,240, filed on May 19, 2008.

(51) Int. Cl.
*G06G 7/62* (2006.01)
(52) U.S. Cl. ............................................. 703/17; 703/13
(58) Field of Classification Search ..................... 703/13, 703/17
See application file for complete search history.

(56) References Cited

U.S. PATENT DOCUMENTS

| | | | |
|---|---|---|---|
| 7,171,647 B1 * | 1/2007 | Smith et al. ..................... | 717/105 |
| 2006/0184564 A1 * | 8/2006 | Castellanos et al. ........... | 707/102 |
| 2008/0091403 A1 * | 4/2008 | Harrison et al. ................. | 703/17 |

OTHER PUBLICATIONS

Gathmann et al., "Inter-site: a new tool for the simulation of spatially realistic population dynamics", Ecological Modelling, vol. 113, Issues 1-3, Nov. 1998, pp. 125-139.*
Riemer, "A Process-Driven, Event-Based Business Object Model", Proceedings, Second International Enterprise Distributed Object Computing Workshop, Nov. 1998, pp. 68-74.*
SIGMA For Windows: The SIGMA Modeling Environment Brief Tutorial, 2003 Custom Simulations, pp. 1-14 http://www.customsimulating.com.
Thomas J. Schriber, et al., Inside Discrete-Event Simulation Software: How It Works and Why It Matters, Proceedings of the 1997 Winter Simulation Conference, pp. 14-22.
Lee Schruben, Simulation Modeling With Event Graphs, Communications of the ACM, vol. 26, No. 11, Nov. 1983, pp. 957-963.
Arnold Buss, Discrete Event Programming With Simkit, Technical Notes, Simulation News Europe, Nov. 2001, Issue 32/33, pp. 15-25.

* cited by examiner

*Primary Examiner* — Kamini S Shah
*Assistant Examiner* — Herng-Der Day
(74) *Attorney, Agent, or Firm* — Dinsmore & Shohl LLP (57) ABSTRACT

The embodiments described herein generally relate to a discrete event simulation (DES) tool which combines the process-driven model and the event-driven model. This integrated process (which uses entities) and event simulation framework according to the various embodiments provides a platform that is appropriate for all combinations of simulation model requirements and at the same time provides higher level of model abstraction. The DES tool instantiates a new paradigm that permits flow of entities at the event-driven model layer that is analogous to their treatment at the process-driven model layer.

5 Claims, 11 Drawing Sheets

DISCRETE EVENT SIMULATION TOOL COMBINING PROCESS-DRIVEN AND EVENT-DRIVEN MODELS

RELATED APPLICATIONS

This patent application claims priority to provisional Patent Application Ser. No. 61/054,240, filed May 19, 2008, entitled "Discrete Event Simulation Tool Combining Process and Event Driven Models."

TECHNICAL FIELD

The present invention generally relates to tools for simulating discrete events and, specifically, to tools which combine process-driven and event-driven models.

BACKGROUND

As background, discrete event simulation (DES) tools are designed to represent the operation of a system having a sequence of chronological events. Each of the events may occur at a particular instant in time and may result in a change of state in the system. Traditional DES tools have often used one of the following models: an event-driven model, a process-driven model, or an activity scanning model. Each of these models has advantages and disadvantages. For example, an event-driven model permits greater control and flexibility but is more complex to implement. As another example, a process-driven model may be easier for non-technical people to understand but may not be able to effectively model complicated systems.

SUMMARY

It is against the above background that embodiments of the present invention described herein generally relate to software tools for representing and simulating the behavior of discrete event systems which combine event-driven and process-driven models. The combination of these two models according to the embodiments of the present invention facilitates the representing of commonly occurring situations as well as simulating complicated systems, and offers advantages vis-à-vis a single-model approach.

In one embodiment, a system for mitigating complexity of simulation logic in performing a discrete event simulation of a modeled system having a sequence of chronological events comprises an event list, an entity list, an integrator, a simulation clock, a processor, an event-driven model, and a process-driven model, wherein: the event list comprises zero or more events which are related to the discrete event simulation, wherein an event comprises a time stamp and a scheduled node, wherein the time stamp represents the time the event is to occur in the simulation and each scheduled node represents a change of state of the system, and; the entity list comprises zero or more entities which are related to the discrete event simulation, wherein each entity comprises a time stamp and a scheduled block, wherein the time stamp represents the time the entity is to be processed in the simulation, and each block represents a process step for the entity; the integrator is operable to read both the event list and entity list, determine which event or entity has the highest priority by determining, based on the associated time stamp, which one will occur first in time, removing the highest priority event or entity from its respective list, and pass the highest priority event or entity to the processor; the simulation clock is operable to be updated to the time stamp of the highest priority event or entity; the processor is operable to receive the highest priority event or entity from the integrator and send the highest priority event to the event-driven model or send the highest priority entity to the process-driven model; the event-driven model is operable to process each node of the event and change a state of the modeled system; and the process-driven model is operable to process entities provided to its blocks during a simulation and changes the state of the modeled system.

In another embodiment, a method for mitigating complexity of simulation logic in performing a discrete event simulation of a modeled system having a sequence of chronological events comprises: receiving a list of entities which is related to the modeled system being simulated, wherein each entity comprises a time stamp and a block, wherein the time stamp represents the time the entity is to be engaged in an activity in the simulation and the block represents a process step for the entity; receiving a list of events which is related to the modeled system being simulated, wherein each event comprises a time stamp and a node, wherein the time stamp represents the time the event is to take place in the simulation and each node represents a change of the state of the system; determining which entity or event has the highest priority by determining which entity or event is to occur first in time, based on their respective time stamps; updating a simulation clock to the time stamp of the highest priority entity or event; removing the highest priority entity or event from its respective list; processing the highest priority entity or event, wherein: an entity is processed by the process-driven model, wherein each entity provided to the model has an associated block within the process-driven model indicating the required processing which will change the state of the modeled system, or an event is processed by the event-driven model, wherein each event provided to the model has an associated node within the event-driven model indicating the required change of state of the modeled system; updating the state of the modeled system; and removing the entity or event from the list after processing.

In yet another embodiment, a computer-readable medium having programming instructions for mitigating complexity of simulation logic in performing a discrete event simulation of a modeled system having a sequence of chronological events, wherein the programming instructions, when executed by a processor, causes operations to be performed, comprises: receiving a list of entities which is related to the modeled system being simulated, wherein each entity comprises a time stamp and a block, wherein the time stamp represents the time the entity is to be engaged in an activity in the simulation and the block represents a process step for the entity; receiving a list of events which is related to the modeled system being simulated, wherein each event comprises a time stamp and a node, wherein the time stamp represents the time the event is to take place in the simulation and the node represents a change of the state of the system; determining which entity or event has the highest priority by determining which entity or event is to occur first in time, based on their respective time stamps; updating a simulation clock to the time stamp of the highest priority entity or event; removing the highest priority entity or event from its respective list; processing the highest priority entity or event, wherein: an entity is processed by the process-driven model, wherein each entity provided to the model has an associated block within the process-driven model indicating the required processing which will change the state of the modeled system, or an event is processed by the event-driven model, wherein each event provided to the model has an associated node within the event-driven model indicating the required change of state of the modeled system; updating the state of the modeled system; and removing the entity or event from the list after processing.

These and additional features provided by the embodiments of the present invention will be more fully understood in view of the following detailed description, in conjunction with the drawings.

BRIEF DESCRIPTION OF THE DRAWINGS

The embodiments set forth in the drawings are illustrative and exemplary in nature and not intended to limit the inventions defined by the claims. The following detailed description of the illustrative embodiments can be understood when read in conjunction with the following drawings, where like structure is indicated with like reference numerals and in which:

DETAILED DESCRIPTION

The present invention is described below with reference to illustrations in the figures of methods and apparatus (systems) according to embodiments of the invention. As will be appreciated by one of skill in the art, embodiments of the present invention may include an entirely hardware embodiment, an entirely software embodiment or an embodiment combining software and hardware aspects. Furthermore, the present invention may take the form of a computer program product on a computer-readable storage medium having computer-readable program code embodied in the medium. Any suitable computer medium may be utilized including hard disks, CD-ROMs, optical storage devices, magnetic storage devices, or programmable ROM devices. It will be further understood that the computer-readable program code may be loaded onto a general purpose computer, special purpose computer, or other programmable data processing apparatus to produce a machine, such that the instructions contain in the code which execute on the computer or other programmable data processing apparatus create means for implementing the functions disclosed herein. The computer-readable program code for implementing the present invention may be written in various object-oriented programming languages, such as Delphi and Java®. However, it is understood that other object oriented programming languages, such as C++ and Smalltalk, as well as conventional programming languages, such as FORTRAN or COBOL, could be utilized. An overview of the embodiments of the present invention now follows.

I. Overview

The embodiments described herein generally relate to a discrete event simulation (DES) tool which combines the process-driven model and the event-driven model. This integrated process (which uses entities) and event simulation framework according to the various embodiments provides a platform that is appropriate for all combinations of simulation model requirements and at the same time provides higher level of model abstraction. The DES tool instantiates a new paradigm that permits flow of entities at the event-driven model layer that is analogous to their treatment at the process-driven model layer.

The embodiments of the present invention may provide a way to mitigate the complexity of simulation logic using a pure event graph methodology within a framework that supports both event- and process-driven models. In its broadest aspects, the DES tool may comprise a first software component, serving as an event/entity integrator which receives as input an entity and an event prioritized by time from the entity and event lists, respectively. The integrator compares the priorities of the entity and event it receives and uses the highest priority entity or event as output. A second software component may serve as an integrated entity/event model which receives an entity or event as input, updates the state of the simulation model, and issues any affected entity or event in the simulation model as output to populate the entity list or event list, respectively. A third software component may serve as an updated entity/event list which receives entities and events that are scheduled in the simulated future as inputs and issues an entity and an event, prioritized by time, as output. A fourth software component may serve as a processor of entities and events which receives an entity or event as input and sends it to the appropriate portion of the simulation model. A fifth software component may serve as a simulation clock, which updates the time of the simulation model by taking the time of the entity or event as an input. A sixth software component may serve as a resource layer, which provides effective management of the resident entities like resources and queues and coordinates process and event driven layers of the integrated simulation model. Greater details concerning each of the above mentioned major components follow after a section providing definitions to terms used herein.

II. Definitions

Events are discrete occurrences which take place in the system being simulated and may change the state of the system. Events typically have a priority which may be based on when the event occurs in time; events that occur earlier in time may have a higher priority than events which occur later in time. As an example, in the context of a store, the selection of an item to purchase by a customer may be considered one event, while the actual purchase may be considered another event. Entities are objects or people which may instigate or respond to an event. Continuing with the store example from above, the consumer may be considered an entity, and the item purchased may be considered an entity. Similar to events, entities may be prioritized by time, such as when the entity enters the system or is used in the system. The simulation of a system may require compiling a list of events which may occur and entities which may be used during the course of the simulation. The events to be simulated may be placed in an event list, and the entities may be placed in an entity list. Alternatively, a single combined list may contain both events and entities.

III. Description of Major Components

Figure 1:
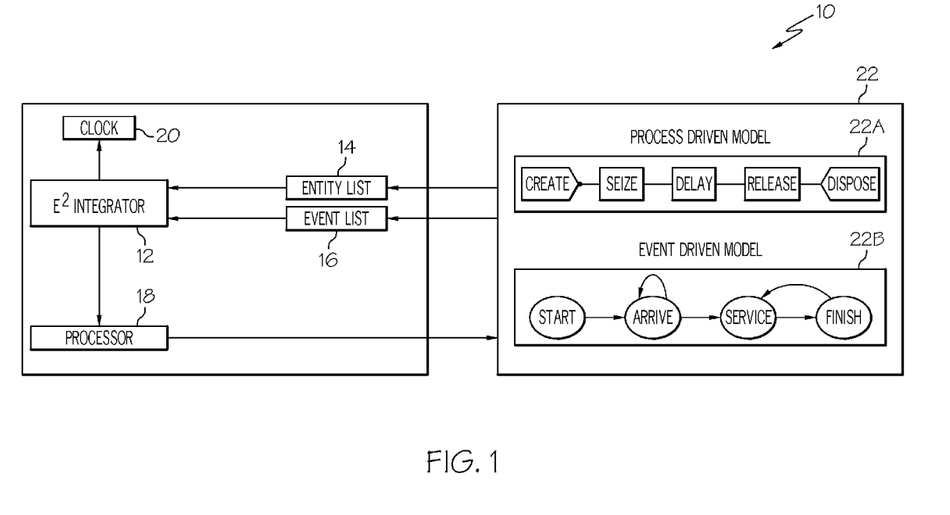
FIG. 1 depicts a block diagram of the DES tool according to one or more embodiments shown and described herein.

As shown in FIG. 1, one embodiment of the DES tool 10 may comprise an integrator 12, and entity list 14, an event list 16, a processor 18, a simulation clock 20, and an event/entity model 22. These elements will be described in detail below.

IV. The Integrator

The main functions of the integrator 12 may be 1) To establish an effective communication between the process-driven and event-driven model components, and 2) The efficient handling of entities and events for better coordination of the hierarchical layers of the model. The integrator 12 has access to the prioritized entity list 14, the prioritized event list 16, the processor 18, and the simulation clock 20. The entity list 14 and event list 16 may comprise active entities and events as they are being populated by the event/entity model 22. The two lists may be sorted according to the time of the next scheduled action for an entity or event, with shorter times having higher priority. In every simulation step, the integrator 12 may compare the priorities of the highest priority item on the entity list 14 and the event list 16, and may remove the one with the highest priority. This entity or event may be used to update the simulation clock 20 to the time that that particular entity or event occurs. The entity or event may subsequently be sent to the processor 18, which routes the entity or event to the appropriate process block or event node, respectively. After handling the entity or event, the event/entity model 22 may make appropriate additions to the entity list 14 and/or event list 16.

V. Event List and Entity List

Figure 1A:
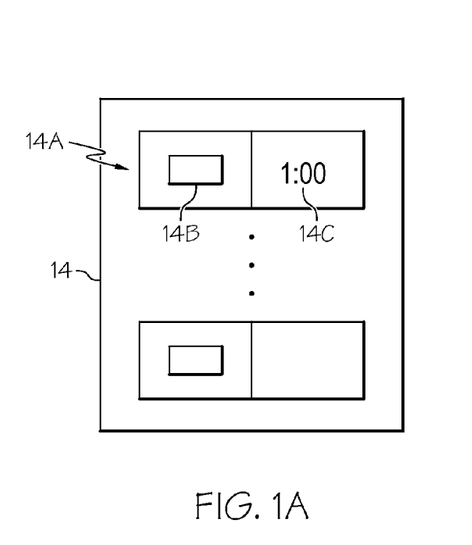
FIGS. 1A and 1B depict an event list and an entity list, respectively, according to one or more embodiments shown and described herein.
Figure 1B:
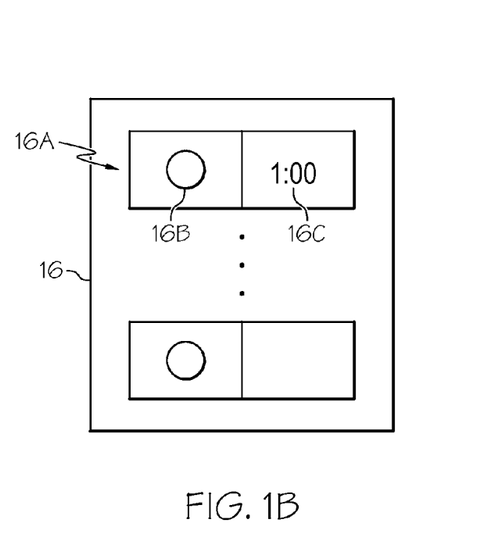

In FIGS. 1A and 1B, the entity list 14 and event list 16 are illustrated. The entity list 14 may comprise zero or more entities 14A. Each entity 14A may comprise a block 14B and a time stamp 14 C. Each block 14 B may be a process step for that particular entity. The time stamp 14 C may indicate at which time the entity is to enter the simulation. Similarly, the event list 16 may comprise zero or more events 16. A Each event 16 A may comprise a node 16 B and a time stamp 16 C. Each node 16 B may indicate a change of state of the system. The time stamp 16 C may indicate at which time the event is to take place in the simulation. Both of these lists may be used during the simulation and may be populated prior to the start of simulation (e.g., when the user is designing the simulation). In addition, the lists may be updated by the event/entity model 22 during simulation. That is, the event/entity model 22 may add an entity to the entity list 14 and/or an event to the event list 16 while the simulation is running.

VI. Processor

Referring again to FIG. 1, the processor 18 receives the entity or event to be processed from the integrator 12. Upon receiving the entity or event, the processor 18 sends the entity to the process-driven model 22A of the event/entity model 22, or it sends the event to the event-driven model 22B of the event/entity model 22.

VII. Simulation Clock

The simulation clock 20 keeps track of the simulated time as the simulation run progresses from start to finish. During the run, the clock 20 may advance in discrete steps, which may or may not be of equal size. After the integrator 12 selects the entity or event with the highest priority, the DES tool may advance the simulation clock 20 to the time stamp associated with that particular entity or event. In this fashion, the clock 20 may constantly be updated during the simulation run.

V. Event/Entity Model

Figure 2:
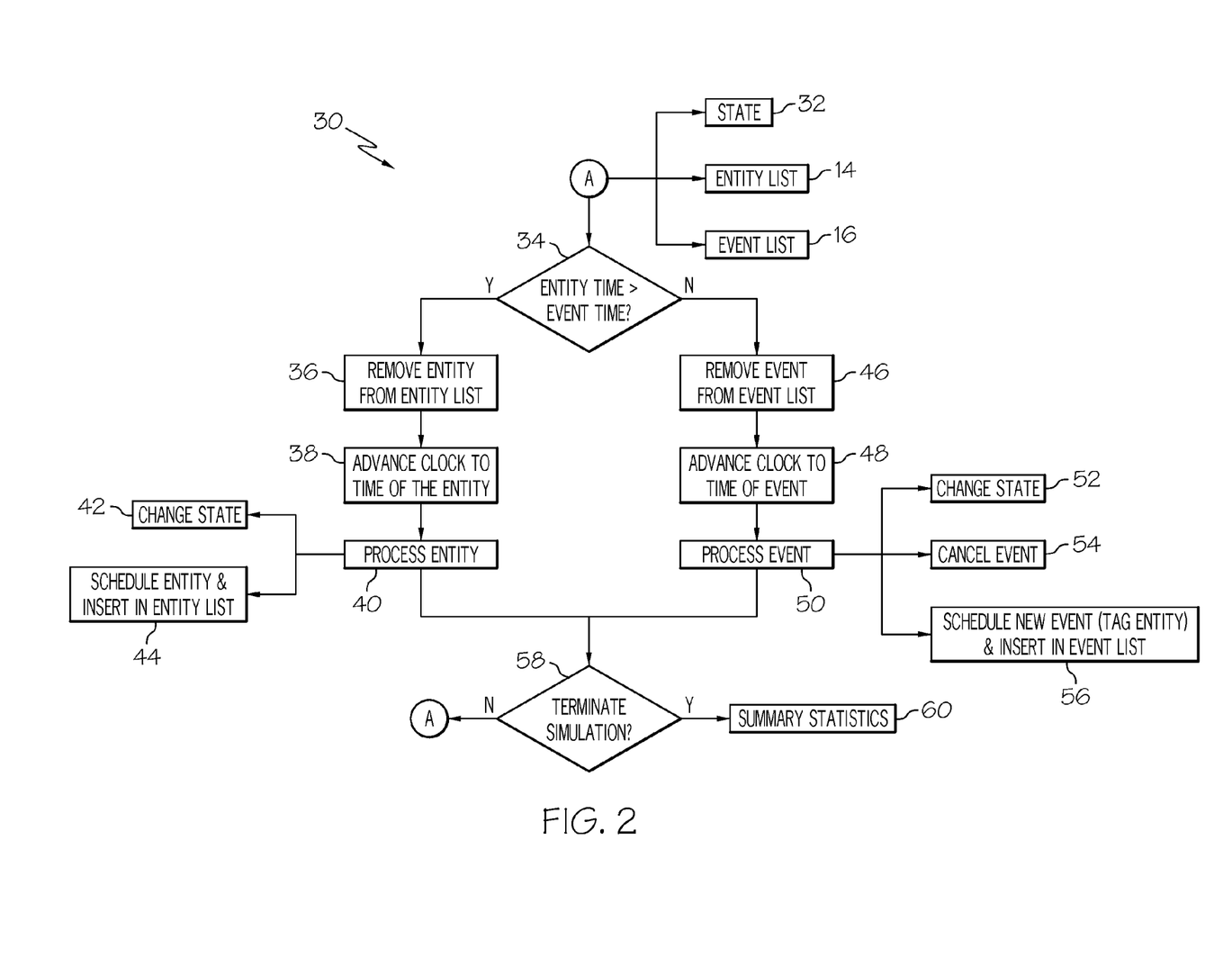
FIG. 2 depicts a flowchart of the DES tool according to one or more embodiments shown and described herein.

Referring still to FIG. 1, the event/entity model 22 may comprise a process-driven model 22A and an event-driven model 22B. The execution of one embodiment of the event/entity model 22 is detailed in the flow diagram of FIG. 2. The simulation model, when executed, initializes the state of the system at step 32 and accesses the highest priority entity from the entity list 14 and from the event list 16. As described herein, at every simulation step, the priorities of the entity and event are compared at step 34. Accordingly, the entity or event with the highest priority is removed from the entity or event list (at steps 36 or 46) and is used to update or advance the simulation clock (at steps 38 or 48). In the next stage of the execution of the simulation model, the entity or event is sent to the processor at step 40 or 50. As described herein, the processor routes the entity or event to the appropriate process block or event node respectively to change the state of the system at step 42 or 52. If the processor is handling an entity, then the entity is scheduled for future process blocks and inserted into the entity list at step 44. On the other hand, if the processor is handling an event, then new events are scheduled and the entity is tagged to the new events (if specified by the simulation model) at step 56. Sometimes a canceling event action may be scheduled; in that case, a scheduled event is cancelled at step 54. At the end of the simulation step, the termination condition is checked at step 58. Simulation continues (i.e., operation is returned to A) if no termination condition is encountered; otherwise simulation is stopped with summary statistics as an output at step 60. Other embodiments of the event/entity model are contemplated.

Figure 3:
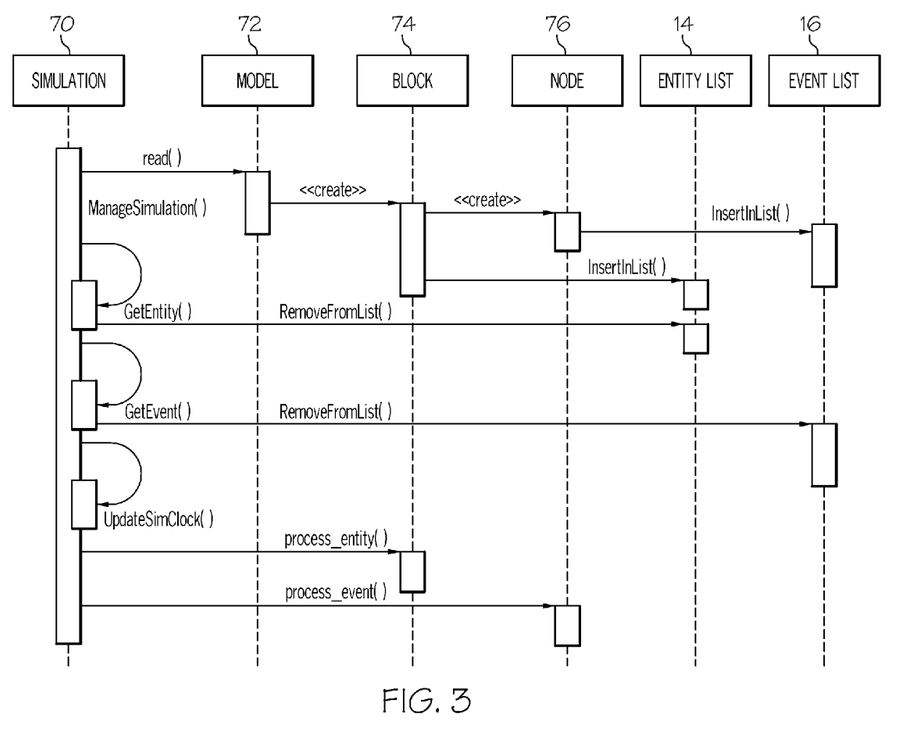
FIG. 3 depicts a message flow diagram according to one or more embodiments shown and described herein.

FIG. 3 illustrates the implementation details of an exemplary DES tool with functionalities of some of the more important classes included in the message flow diagram. The Simulation class 70 handles both entities and events, updates the simulation clock, and determines the order of processing. Before the execution of the simulation model, the Simulation may invoke the read() method of the Model class to read the simulation model from the user or simulation modeler through the interface. The main functionality of the Model class 72 may be to convert the simulation model being built through the interface to appropriate instantiations of blocks (Block class 74), nodes (Node class 76), connections between blocks, scheduling arcs between nodes, resources, queues, and so forth. When the simulation model is operating, blocks and nodes populate the entity list 14 and event list 16 with entities and events, through InsertInList()method, respectively. The ManageSimulation ()method of the Simulation class 70 may get an entity or event (GetEntity()/GetEvent()) and may compare their priorities using their respective time stamps. The entity or event with earliest time is considered to be the highest entity or event to be processed. The highest priority entity or event is used to update the simulation clock (UpdateSimClock()) and processed accordingly using ProcessEntity() or ProcessEvent() method.

VI. The Event-Driven Model

Figure 4:
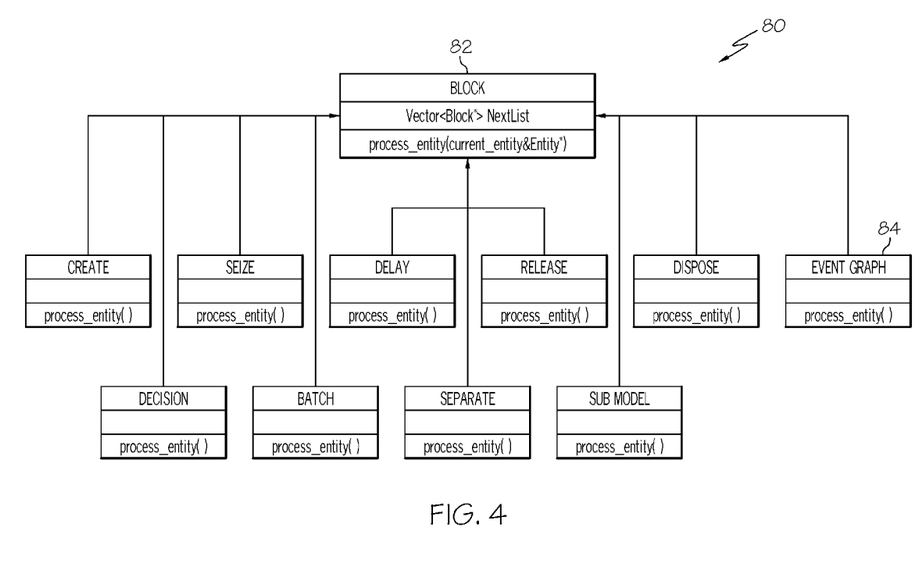
FIG. 4 depicts the inheritance relationship between blocks according to one or more embodiments shown and described herein.

The event/entity model 22 may provide hierarchical modeling capabilities with process-driven and event-driven components as the upper and lower layers, respectively. It may also provide an interface for the user to build process-driven models. Process-driven models created by the user may be a collection of appropriate, interconnected process blocks. Referring to FIG. 4, in order to hierarchically embed event-driven models within a process-driven model, the event/entity model provides an 'EventGraph' block 84. The 'EventGraph' block 84 behaves as a regular process block as well as a workspace for containing an event-driven model. The event-driven model, which is created in the 'EventGraph' block 84, updates the state of the system, schedules events, and also coordinates with the process-driven model for smooth transition of the entities into and out of the block. The generic "Block" class 82 shown in the class diagram 80 may define the common features of all blocks. Such features may include the virtual ability to process an entity given as input and provide an entity linked to a block as output. The individual classes for each specific block (e.g. EventGraph 84) may instantiate the particular functionality of that type of block through a specific process_entity method.

Figure 5:
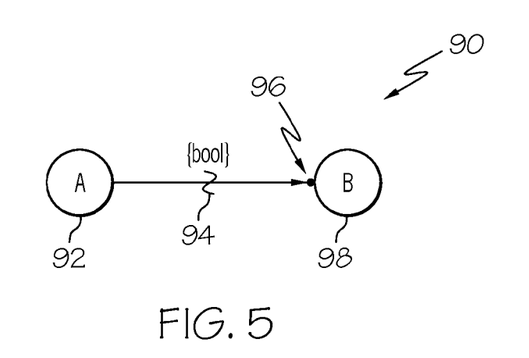
FIG. 5 depicts the entity interaction with the events according to one or more embodiments shown and described herein.

In FIG. 5, entities exist and move around the event layer by being tagged to an appropriate event. Event A 92 may schedule event B 98 using a scheduling arc 94 that has an entity 96 associated with it. During a simulation, the act of scheduling an event may cause an event to be added to the events list 14 with an entity 96 tagged to it.

Figure 6:
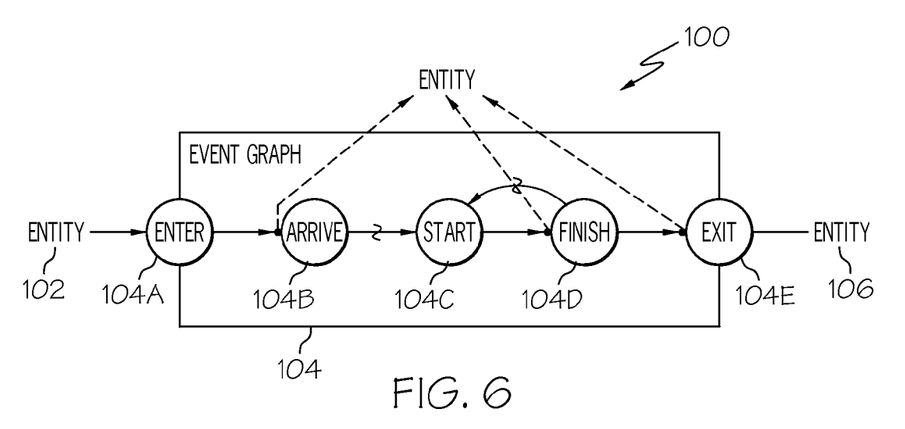
FIG. 6 depicts a process-driven flowchart according to one or more embodiments shown and described herein.

As shown in FIG. 6, an entity 102 that enters the event-driven model 100 or 'EventGraph' block 104 may make its attributes available to the events. The entity that enters the event-driven model is not destroyed: it may be tagged (as shown in FIG. 5) to any event that it triggers. The entity attributes may be updated by the events that occur within the block. The entity may be held by the event-driven model 104 until it exits the block by the triggering of an Exit event 104E. The updated entity then returns to continue processing by the process-driven components of the simulation engine.

Figure 7:
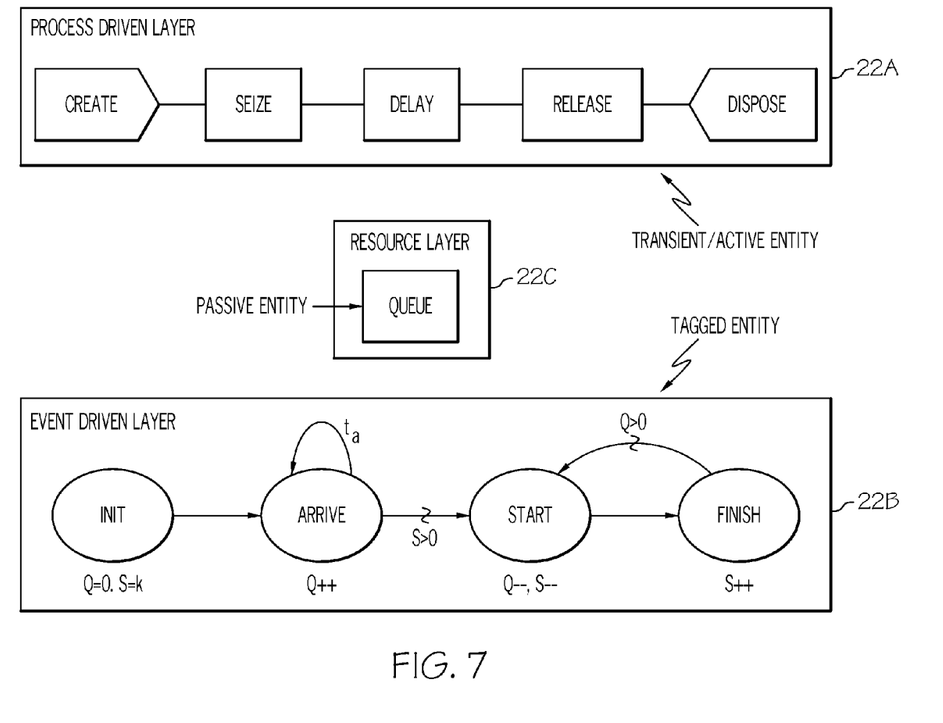
FIG. 7 depicts the various stages of the entity at different layers of the integrated simulation model according to one or more embodiments shown and described herein.

One feature of the event/entity model is that it may explicitly model the entity flow taking place at the event level. This feature augments the capabilities of a simulation modeler by making some aspects of process logic available in the event layer and vice versa. However, the two layers may be different when they interact with resident entities like resources, queues, etc. As depicted in FIG. 7, one embodiment of the DES tool provides an intermediate resource layer 22C that handles queues and resources for the process- and event-driven models. This flexibility provided by the intermediate layer may reduce the level of modeling abstraction at the event graph level and may lead to a more seamless event/entity model that spans the two levels. However, the entities may change their states, depending upon the layer in which they reside. In an event/entity simulation model, entities may be in one of the following three states:

Transient: In a typical process-driven approach, a model is simulated as an entity or entities going through different processes as time evolve. The state of an entity in such a model can be called a transient state. As shown in FIG. 7, transient entities are usually associated with the process-driven layer.

Passive: Any entity that is either in a queue, awaiting for an idle resource, or blocked at any stage of the simulation model is called a passive entity. As shown in FIG. 7, passive entities reside in a queue of the resource layer.

Tagged: Entities are explicitly modeled in the event-driven layer of the event/entity model as a tagged entity. In this state, the entities are associated with events. Entities move around the event-driven layer, as in process logic, by 'tagging' themselves to a relevant event that is triggered.

Other states may be used to characterize entities, such as an active state or a ready state.

Continuing to refer to FIG. 7, the resource layer 22C is the layer in the DES tool that may be used to manage the resident entities like resource, queues etc. The resources in a simulation model can represent machines, operators, or any other finite capacity objects. The entities in the model may compete for these Resources. When the resource is occupied or busy with other entities, newly arriving entities wait in the Queue. This inherent relationship between the Resource and Queue and their interactions with other parts of the model may be important to a simulation modeler. These important factors are often carefully considered while building the framework for event/entity models. The resource layer 22C has been designed to be a separate layer from the process-driven layer 22A and the event-driven layer 22B. The main aim of the resource layer 22C is to hold the process components (in this case, queues and resources) that are common to both the layers and establish a communication between the layers. The functions of the resource layer can be summarized as follows: 1) To control access to the resident entities (i.e. resource, queue) and 2) Effectively manage the global and local resident entities in large simulation models. For effective data management, a simulation model often requires defining resources that are either global or local to different parts of the model parts. In order to have a structured way of accessing resources, the 'Resource' and 'Queue' objects are instantiated and stored in the 'Model' class (referring again to FIG. 3). The purpose of associating them with the 'Model' class is to centralize the control of the resident entity objects. The 'Model' class is the main class that interfaces with the modelers while building an integrated simulation model. The simulation modeler accesses the resident entities in the 'Model' class through the user interface to associate them with appropriate parts of the model.

An important feature of standard event graphs may be the parameterization of the event vertices, which allows similar model sub-graphs to be combined together as a generic graph distinguished by parameter values. The event/entity approach has been further enhanced to explicitly represent entities at the event-driven level. This addition to the integrated simulation framework helps to diminish the abstraction involved in parameter passing. The solution lies in explicitly passing the entities through the event-driven model as shown in FIGS. 5 and 6. Event parameters are replaced by entity attributes. The usage of entities in the event-driven layer may serve two purposes: 1) Reduce the abstraction by manipulating entity objects instead of working with parameters as in a programming language, and 2) Give the intuitive feel of process-driven models to modelers at the event level, which enhances the appeal of the event-driven models.

VII. Supply Chain Example

Figure 8:
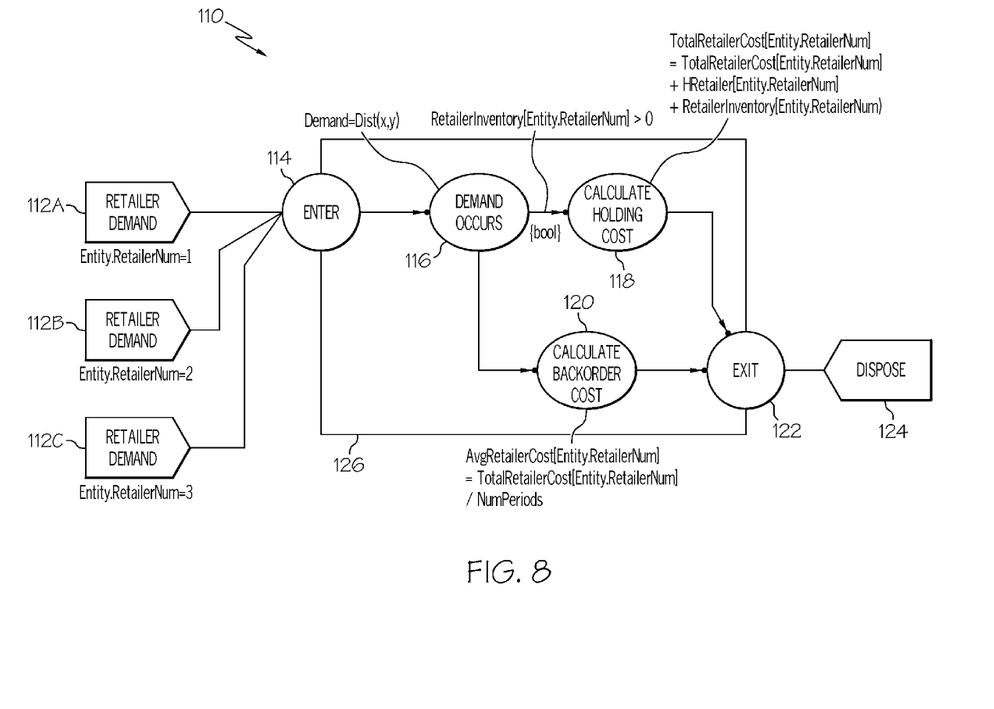
FIG. 8 depicts a user interface according to one or more embodiments shown and described herein.

In order to illustrate both the process- and event-driven model components in an event/entity model, an example of a supply chain system is shown in FIG. 8. This model focuses on a supplier-retailer supply chain, consisting of a single supplier and three retailers. The publication *Evaluating the Impact of Retailer Gaming and Supplier Capacity Allocation on Supply Chain Costs* (Vutukuru, 2006) also discuss this example in detail. The model 110 considers how partial information sharing has an impact on the supply chain costs with different allocation mechanisms on the supplier side vis-à-vis gaming behaviors on the retailer side. The model 110 was originally implemented in the ARENA simulation tool.

Referring still to FIG. 8, this model 110 relates to retailer demand and cost sub-models. The retailer demand entities are created in the create blocks 112A-C, where the number of Create blocks depends upon the number of retailers in the model. The entities enter the EventGraph block 126 through the Enter event 114 and schedules events, update attributes, and check conditions as follows. The state variables for this example may be RetailerInventory[i], TotalRetailerCost[i], AvgRetailerCost[i], and HRetailer[i], where 'i' represents entity parameter and NumPeriods represents number of time periods. Boolean conditions, represented by {bool}, on the scheduling arcs either return a true or a false:

{bool}$_1$: RetailerInventory[Entity.RetailerNum]>0, Entity Transfer: Yes

{bool}$_2$: RetailerInventory[Entity.RetailerNum]≦0, Entity Transfer: Yes

Attributes of the entity (i.e., the customer) may be RetailerNum, which is the time at which customer/entity enters the queue. Using the symbol (dot) for an entity in an event graph, FIG. 8 shows an exemplary event/entity model of the retailer demand and cost. The model primarily consists of three process blocks: Create 112A-C, EventGraph 126, and Dispose 124. The following is a brief description of the functionalities of each block. In the Create block 112A-C, retailer daily demand (i.e., an entity is created) occurs and arrives at 21:00 hours. The Entity.RetailerNum is updated as 1, 2, 3 . . . etc., accordingly, depending upon the Create block 112A-C in which it is created, to represent the different retailers. The EventGraph block 126 consists of an Enter event 114 and an Exit event 122. These blocks provide a work space for building the event-driven portion of the model. The Dispose block 124 may occur when the finished retailer demand/entities exit the model.

The event nodes in the EventGraph block 126 are defined as follows. Entities use Enter event 114 as a gateway to event graph model, in the EventGraph block 126. The attributes of the entering entity are available to the event for state changes and for scheduling other events. In this example, an event called DemandOccurs 116 is scheduled which generates the demand through a known distribution Dist(x,y) to update the variable Demand. Two different events are scheduled by checking the conditions, {bool}$_1$ and {bool}$_2$. First, CalculateHoldingCost may be executed if {bool}$_1$ is true. In this case, the holding cost of the retailer is calculated as TotalRetailerCost[Entity.RetailerNum]=TotalRetailerCost[Entity.RetailerNum]+HRetailer[Entity.RetailerNum]+RetailerInventory[Entity.RetailerNum]. The Exit event 122 is then scheduled unconditionally. Second, if {bool}$_2$ is true, the backorder cost of the retailer is calculated in this event as follows: AvgRetailerCost[Entity.RetailerNum]=TotalRetailerCost[Entity.RetailerNum]/NumPeriods. The Exit event 122 is then scheduled unconditionally, at which time the entity is transferred into the process model.

The event/entity model may use the concept of event parameterization through the entity attributes. One advantage of using the entity attributes in the event/entity model may be that the similar model sub-graphs can be combined together as a generic sub-graph distinguished by entity attribute values (e.g. RetailerNum). At the event level, entities are handled as objects in a way that is analogous to their treatment in the process models. The attributes of an entity (like RetailerNum) are defined by the modeler, enabling the flexibility and explicit handling of entities at the event level. Instead of passing information as event parameters to other nodes as in a programming language, the event/entity model defines them explicitly as attributes of entities that are associated with events as they are scheduled. This entity passing through the events in the event graph gives the intuitive feel of the process-driven model to the modelers. This modeling of entity flow through the event graph enhances the appeal of event graphs to modelers with a process perspective, while retaining the power and flexibility of the event logic. At the process level, the modelers' ability is enhanced to model complex logic without resorting to programming languages in a simulation model. One objective of the event/entity model is to diminish the gap between real world processes and their representation in the simulation environment and not limiting itself to the graphical representation.

VIII. GUI for Entity Interface

Figure 9:
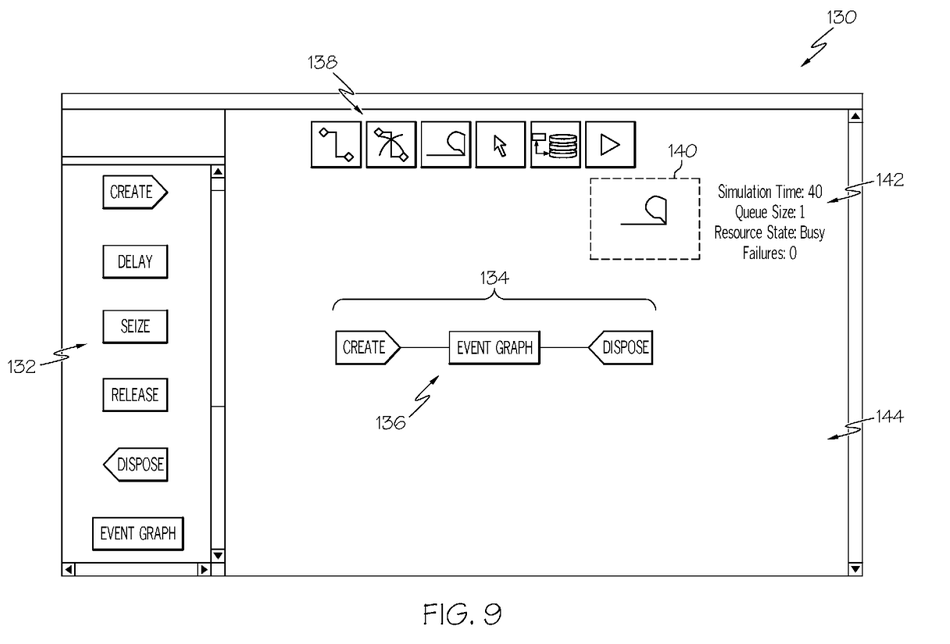
FIG. 9 depicts an interface for the event-driven layer model according to one or more embodiments shown and described herein.

FIG. 9 illustrates one embodiment of the entity interface 130 of the event/entity simulation framework. The interface 130 may comprise a process block menu panel 132, work space 144, menu strip 138, animation 140, and variables display 142. The process block menu panel 132 may consist of commonly used process block i.e. Create, Delay, Seize, Release, Dispose, Assign and EventGraph. These blocks can be dragged and dropped onto the work space 144 in as similar fashion to other commercially-available DES software. The menu strip 138 provides tools for the modelers to 1) Connect any two process blocks, 2) Disconnect any two process blocks, 3) Provide information about the resources and queues, 4) Enter data for the process blocks, 5) Run the simulation, and 6) Return to default cursor. The animation 140 part of the entity interface 130 displays the animation of the machine or server and its interaction with the entities. The variables display 142 portion of the interface displays the values of the important variables as the simulation is running.

IX. GUI for Event Interface

Figure 10:
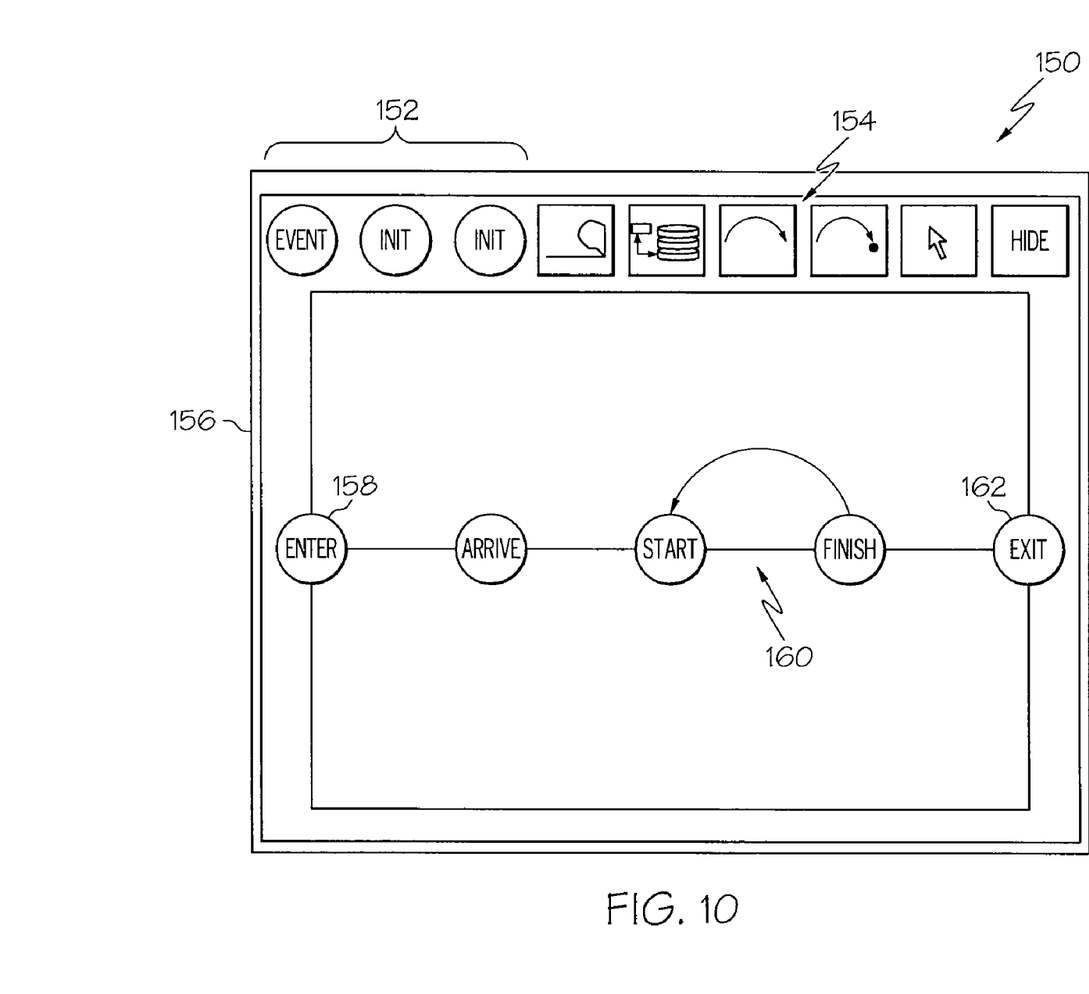
FIG. 10 depicts an interface for the process-driven layer model according to one or more embodiments shown and described herein.

FIG. 10 illustrates one embodiment of the event interface 150 for the event-driven models which may be invoked when the modeler clicks the EventGraph block 156 for data entry. The event/entity arc 160 is represented by red lines in the interface for the EventGraph. The event interface may comprise the event node panel 152, menu strip 154, an Enter node 158, and an Exit node 162. The event node panel 152 may comprise three types of nodes i.e. regular node, initialization node, and initialization node with entity tagged to it. The menu strip 154 may have buttons to 1) Provide information about resources and queues, 2) Enter data into the event nodes, 3) Schedule arcs between two nodes, 4) Schedule arcs with tagged entity between two nodes, 5) Return to default cursor, and 6) Hide or minimize the EventGraph window.

The following example illustrates one embodiment of the DES tool which contains both the process-driven and event-driven model components in an integrated event/entity model. This example concerns customers entering a bank to conduct a transaction with one of the multiple servers (e.g. bank tellers). The customers arrive and wait in a FIFO (First In First Out) queue. A bank server is selected at random from the available servers. After processing, the customers leave the bank. The purpose of the model is to simulate the waiting time statistics for individual customers. The simulation clock time is given the name Time. The service time required for a server to process a customer is $t_s$. The state variables describing the system are: S: Number of servers available and Q: Number of customers that are waiting for processing. Boolean conditions on the scheduling arcs either return true or false:

{bool}$_1$: S>0, Entity Transfer: No

{bool}$_2$: Q>0, Entity Transfer: No

Attributes of the entity (customer) are as follows:

QueueEnterTime: Time at which customer/entity enters the queue

TimeInQueue: Waiting time in queue of the customer/entity

Figure 11:
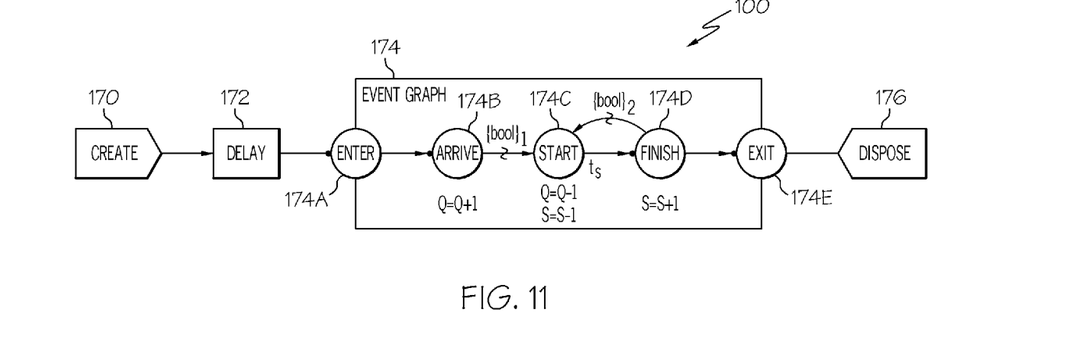
FIGS. 11 and 12 depict an DES tool embodiment showing an integrated event/entity model queuing example being used with multiple servers.
Figure 12:
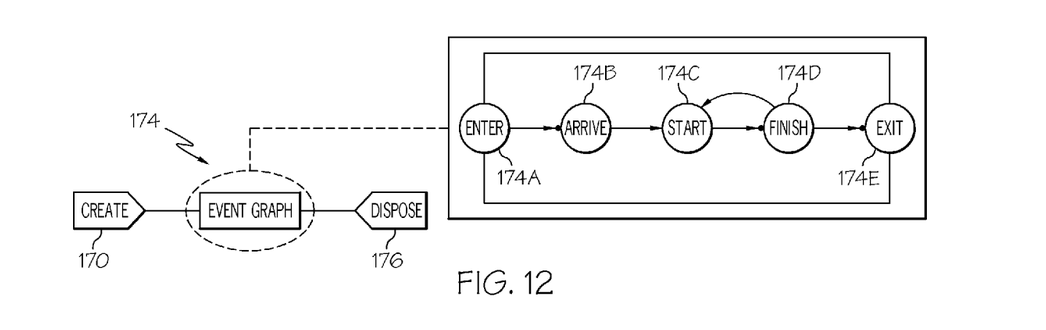

FIGS. 11 and 12 illustrate an integrated event/entity model of this simple queuing example with multiple servers. The dot symbol is used for an entity in an event graph. The model primarily consists of three process blocks i.e. Create 170, Delay 172, EventGraph 174, and Dispose 176. The following is a brief description of the functionalities of each block. The Create block 170 models the customer (entity) creation with inter-arrival time $t_a$. The Delay block 172 models the time the customer (entity) is delayed $t_d$. The EventGraph block 174, by default, consists of an Enter event 174A and an Exit event 174E. These blocks provide a work space for building the event-driven portion of the model. The Dispose block 176 models when the customers (entities) exit the model.

The event nodes in the EventGraph block 174 are defined as follows. The Enter event 174A acts as the gateway for an entity into the event graph model in the EventGraph block 174. The attributes of the entering entity are available to the event for state changes and for scheduling other events. The Arrive events 174B are always scheduled with an attached entity. The entity object is stored in the queue (Q=Q+1). A Start event is scheduled when a server is free, at which time QueueEnterTime=Time. At the beginning of the Start event 174C, no entity is attached. Next, an customer (entity) is retrieved from the queue (Q=Q−1). Next, one unit of the resource (teller) is made busy (S=S−1) and the entity begins the processing. The time in the queue is calculated as TimeInQueue=Time−QueueEnterTime. Next, the Finish event 174D signifies the end of the processing for an entity and a unit of resource is freed. Finally, Exit 174E acts as a gateway back into the process model for an entity.

In standard event graphs, attributes of entities in a queue must be stored somewhere in the simulation environment. For example, the waiting times of entities could be stored in an array variable. To store attributes, the customer ID attribute of an entity can be used as a lookup in the array. To implement this in a standard event graph, edge attributes and event parameters may be necessary to implicitly model entity ownership of information. In addition, a number of updating statements to counter-type variables must be added to the model. In the standard implementation of event graphs, the modeler is not required to explicitly keep track of entity flow through the events while building a simulation model. The integrated entity/event model approach forces a modeler to think in terms of entities and not in programmer-level abstractions such as parameter passing. At the same time the model-builder is not deprived of the event graph capabilities. On comparing the two models of the same problem in two different simulation environments, one can observe that in an integrated event/entity model, a modeler can reach the same goals without resorting to a "programming" type of approach. This demonstrates the attenuation of abstraction in the integrate event/entity model in comparison with a classical event graph.

It should now be understood that the systems and methods described herein may be used to simulate the occurrence of discrete events. They may be implemented on a computer system, such as a computer dedicated to simulating discrete event systems.

While particular embodiments and aspects of the present invention have been illustrated and described herein, various other changes and modifications may be made without departing from the spirit and scope of the invention. Moreover, although various inventive aspects have been described herein, such aspects need not be utilized in combination. It is therefore intended that the appended claims cover all such changes and modifications that are within the scope of this invention.

What is claimed is:

1. A simulation system for mitigating complexity of simulation logic in performing a discrete event simulation of a modeled system having a sequence of chronological events, comprising:
   an event list,
   an entity list,
   an integrator,
   a simulation clock,
   a processor,
   an event-driven model comprising a plurality of nodes that are interconnected with a plurality of arcs, wherein each node represents a change of state of the modeled system and each arc represents scheduling of one of the plurality of nodes; and
   a process-driven model comprising a plurality of blocks that are interconnected, wherein each block represents a process step and the plurality of blocks comprises an event graph block, wherein the event graph block comprises at least one node of the plurality of nodes of the event driven model for processing any tagged entity, wherein during the discrete event simulation:
   the event list comprises multiple events which belong to the chronological events of the discrete event simulation, wherein each of the events comprises an event time stamp associated with one of the nodes that represents the time the event is to occur in the discrete event simulation;
   the entity list comprises multiple entities which are related to the discrete event simulation, wherein each of the entities comprises an entity time stamp associated with one of the blocks that represents the time the entity is to be processed in the discrete event simulation, and wherein at least one of the multiple entities is not directly associated with the multiple events in the event list;
   the integrator reads both the event list and the entity list, determines which event or entity has the highest priority by determining, based on the entity time stamp and the event time stamp, which will occur first in time, updates the event list or the entity list by removing the event having the highest priority or the entity having the highest priority from its respective list, wherein the entity having the highest priority is removed from the entity list or the event having the highest priority is removed from the event list, and passes the event having the highest priority or the entity having the highest priority to the processor;
   the simulation clock is updated to the highest priority event time stamp or entity time stamp;
   the processor receives the highest priority event or entity from the integrator and processes the highest priority event according to the event-driven model or processes the highest priority entity according to the process-driven model;
   the entity list is further updated when a new entity is created and the event list is further updated when a new event is scheduled or an existing event is canceled; and
   the multiple entities are processed according to the blocks, wherein the multiple entities provide their attributes to the blocks.

2. The simulation system of claim 1 further comprising a resource manager, wherein the resource manager manages internal entities for the process-driven and event-driven models.

3. The simulation system of claim 2 wherein the internal entities are queues and resources.

4. A method for mitigating complexity of simulation logic in performing a discrete event simulation of a modeled system having a sequence of chronological events, the method comprising:
   receiving an event list comprising multiple events which belong to the chronological events of the discrete event simulation, wherein each event comprises an event time stamp associated with a scheduled node that represents the time the event is to take place in the discrete event simulation;

receiving an entity list comprising multiple entities which are related to the discrete event simulation, wherein each of the entities comprises an entity time stamp associated with one of a plurality of blocks that represents the time the entity is to be processed in the discrete event simulation, and wherein at least one of the multiple events is not directly associated with the multiple events in the event list;

determining which event or entity is to occur first in time, based on the entity time stamp and the event time stamp;

associating a highest priority to the event or the entity that is to occur first in time;

removing the entity associated with the highest priority from the entity list or the event associated with the highest priority from the event list;

updating a simulation clock to the entity time stamp of the entity associated with the highest priority or the event time stamp of the event associated with the highest priority;

processing, automatically with a processor, the entity associated with the highest priority according to a process-driven model or the event associated with the highest priority according to an event-driven model, wherein: the event-driven model comprises a plurality of nodes that are interconnected with a plurality of arcs, wherein each node represents a change of state of the modeled system and each arc represents scheduling of one of the plurality of nodes; and the process-driven model comprises the plurality of blocks, wherein each block represents a process step, the plurality of blocks that are interconnected, and the plurality of blocks comprises an event graph block, wherein the event graph block comprises at least one node of the plurality of nodes of the event driven model for processing any tagged entity;

updating the entity list when a new entity is created;

updating the event list when a new event is scheduled or an existing event is cancelled; and processing the multiple entities according to the blocks, wherein the multiple entities provide their attributes to the blocks.

5. A non-transitory computer-readable medium having programming instructions for mitigating complexity of simulation logic in performing a discrete event simulation of a modeled system having a sequence of chronological events, wherein the non-transitory computer-readable medium comprises a hard disk, a CD-ROM, an optical storage device, a magnetic storage device, or a programmable ROM device and the programming instructions, when executed by a processor, cause operations to be performed, the operations comprising:

receiving an event list comprising multiple events which belong to the chronological events of the discrete event simulation, wherein each event comprises an event time stamp associated with a scheduled node that represents the time the event is to take place in the discrete event simulation;

receiving an entity list comprising multiple entities which are related to the discrete event simulation, wherein each of the entities comprises an entity time stamp associated with one of a plurality of blocks that represents the time the entity is to be processed in the discrete event simulation, and wherein at least one of the multiple events is not directly associated with the multiple events in the event list;

determining which event or entity is to occur first in time, based on the entity time stamp and the event time stamp;

associating a highest priority to the event or the entity that is to occur first in time;

removing the entity associated with the highest priority from the entity list or the event associated with the highest priority from the event list;

updating a simulation clock to the entity time stamp of the entity associated with the highest priority or the event time stamp of the event associated with the highest priority;

processing the entity associated with the highest priority according to a process-driven model or the event associated with the highest priority according to an event-driven model, wherein: the event-driven model comprises a plurality of nodes that are interconnected with a plurality of arcs, wherein each node represents a change of state of the modeled system and each arc represents scheduling of one of the plurality of nodes; and the process-driven model comprises the plurality of blocks, wherein each block represents a process step, the plurality of blocks that are interconnected, and the plurality of blocks comprises an event graph block, wherein the event graph block comprises at least one node of the plurality of nodes of the event driven model for processing any tagged entity;

updating the entity list when a new entity is created;

updating the event list when a new event is scheduled or an existing event is cancelled; and processing the multiple entities according to the blocks, wherein the multiple entities provide their attributes to the blocks.

* * * * *